US006668550B2

(12) United States Patent
Yazawa et al.

(10) Patent No.: US 6,668,550 B2
(45) Date of Patent: Dec. 30, 2003

(54) METHOD AND APPARATUS FOR CONVERTING DISSIPATED HEAT TO WORK ENERGY

(75) Inventors: Kazuaki Yazawa, Chiba (JP); Avram Bar-Cohen, St. Louis Park, MN (US)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/994,175

(22) Filed: Nov. 26, 2001

(65) Prior Publication Data

US 2003/0097839 A1 May 29, 2003

(51) Int. Cl.⁷ .................................................. F01B 29/10
(52) U.S. Cl. ............................................ 60/527; 60/528
(58) Field of Search ........................... 60/527, 528, 529

(56) References Cited

U.S. PATENT DOCUMENTS

| 5,261,597 | A | * | 11/1993 | Perlman et al. ........... 236/93 R |
| 5,743,466 | A | * | 4/1998 | Humburg ................ 237/12.3 B |
| 6,226,992 | B1 | * | 5/2001 | Kutlucinar et al. ........... 60/528 |
| 6,374,608 | B1 | * | 4/2002 | Corris et al. ................. 60/528 |

* cited by examiner

*Primary Examiner*—Hoang Nguyen
(74) *Attorney, Agent, or Firm*—Sonnenschein, Nath & Rosenthal LLP (57) ABSTRACT

A method for converting low temperature dissipated heat to other useful energy and apparatus therefor. Heat energy is transferred to a shape memory alloy using natural conduction of the heat. The kinetic energy of the shape memory alloy resulting from cyclic temperature variations is transferred to another type of energy such as electrical energy.

49 Claims, 8 Drawing Sheets

METHOD AND APPARATUS FOR CONVERTING DISSIPATED HEAT TO WORK ENERGY

BACKGROUND OF THE INVENTION

The present invention generally relates to methods and apparatuses for dissipating heat away from devices generating heat. In addition, the invention relates to methods and other apparatuses for converting heat energy into other forms of energy.

Since the thermodynamic "availability," or energy content, of a solid or fluid increases strongly with absolute temperature, efficient electric power generation from a heat source is usually performed at elevated temperatures, often in the range of 600° C.–800° C. In the categories of high temperature conversion, the systems are generally large, with each generator unit producing megawatts of electric power and occupying a volume of 10 $m^3$ to 100 $m^3$. Alternatively, lower temperature equipment operating between 100° C. and 200° C., have been developed to recover energy from solar-concentrator heated fluids, geothermal sources and waste heat rejected by high temperature conversion systems.

One prior art approach of utilizing waste heat is taught by U.S. Pat. No. 3,878,410, issued to the United States Energy Research and Development Administration, which is directed to a two-phase liquid metal magneto-hydrodynamic generator. The '410 patent uses a gas injected into a liquid metal which reduces the density of the liquid metal causing an increased convection flow of the liquid metal within a channel. The liquid metal flows past a heat source where the heat is transferred to the liquid metal. This prior art contains deficiencies, though. For example, as disclosed, the '410 patent requires a pump to circulate the liquid metal through the channel. This additional pump not only adds components to the system and requires maintenance; but also, consumes electrical power. Thus, the '410 patent has to pay an electrical energy penalty for the required pumping. Further, a pump adds vibrational and acoustical interference to the system.

In the marketplace, many products generate heat in the low temperature range below 150° C. For example, electrical components, such as integrated circuits including a central processor unit (CPU) for a computer operating in close proximity within an enclosed electronic apparatus, produce heat. To prevent thermal failure of one of the electrical components in the enclosed electronic apparatus this heat needs to be dissipated. These enclosed electronic apparatuses are common and typically include personal computers, laptop computers, display monitors, computer peripherals, television sets, projectors, projection monitors, handheld personal digital assistants (PDAs), cellular phones, facsimile machines, video cassette recorders (VCRs), digital versatile disc (DVD) players, audio systems and similar equipment.

Thermal management of the electronic components in the enclosed electronic apparatus is necessary to prevent the enclosed electronic apparatus from failing or to extend the useful life of the enclosed electronic apparatus. For instance, a typical CPU operating in a personal computer may operate at a maximum temperature of 70° C. without experiencing a thermal failure; but due to the heat generated by a typical CPU, however, the temperature often reaches 100° C. and above which could lead to thermal failure.

SUMMARY OF THE INVENTION

The present invention provides a heat dissipating device and method useful for converting heat energy to work energy operating in low temperature ranges and with low temperature differentials.

In an embodiment, the invention provides the heat dissipating device and method for using same in which heat emitted by an electrical component is dissipated and converted to work energy without additional input energy.

In an embodiment, the heat dissipating device includes a shape memory alloy member having a first configuration in the austenite state according to a first temperature. The shape memory alloy member changes phase via hysterisis when exposed to heat above a predetermined temperature wherein the shape memory alloy member thermally contracts to a second configuration corresponding to the martensite state upon cooling to a second temperature resulting in a reciprocal displacement of the shape memory alloy.

In an embodiment, the heat dissipating device includes a heat exchanger which is thermally attached to the shape memory alloy member to dissipate the heat from the shape memory alloy member. Further, a bias member which is flexably connected to the shape memory alloy member biases the shape memory alloy member back to the first configuration after the heat is dissipated.

In an embodiment, the invention includes an energy converter to produce current in response to the movement of shape memory alloy member and to extract the current to an electrical storage. This embodiment also provides that the bias member is a spring connected substantially near a first end of the shape memory alloy member while the heat exchanger thermally attaches to a second end of the shape memory alloy member.

In an embodiment, the invention includes a plate member to thermally attach to a plurality of shape memory alloy members. In this embodiment, the bias member connects to the plate member to bias the plate member causing the plurality of shape memory alloy members to extend back to the first configuration.

The present invention also provides for methods of dissipating heat from the electrical component. The method also provides for regenerating electricity from the heat removed from the electrical component.

In one method, at least one shape memory alloy member is disposed within an enclosure wherein a first end is positioned adjacent to an electrical component while a second end is positioned adjacent to a heat exchanger. Within the enclosure, the shape memory alloy member has a first configuration corresponding to a first temperature. The shape memory alloy member is positioned adjacent to the electrical component, in the first configuration.

As the shape memory alloy member is exposed to the electrical component, the heat from the electrical component transfers to the shape memory alloy member. Accordingly, the shape memory alloy member undergoes a phase change by the heat from the electrical component. The shape memory alloy member phase changes to a second configuration at the second temperature while dissipating the heat from the electrical component through a heat exchanger. After the heat is dissipated the shape memory alloy member is biased back to the first configuration by a bias member resulting in a reciprocal displacement of the shape memory alloy member.

In another method, an energy converter is connected to at least one shape memory alloy member wherein the energy converter produces a current in response to the movement of the shape memory alloy member. Next, the current is derived from at least one shape memory alloy member to an electrical storage.

In another method, a plurality of shape memory alloy members are thermally attached to a plate member. In this other method, the plate member is positioned between the electrical component and the heat exchanger wherein the bias member connects to the plate member. Then, the plurality of shape memory alloy members contract to the second configuration of the martensite state pulling the plate member toward the electrical component. The next step provides that the bias member then in turn biases the plate member along with the plurality of shape memory alloy members back to the first configuration.

The present invention has many advantages. These advantages relate to cooling an electrical component and generating energy from the heat emitted by the electrical component.

It is an advantage of the present invention to transfer heat from a component through a heat exchanger to a heat reservoir.

It is an advantage of the present invention to generate electricity from heat dissipated from a component without requiring additional energy.

It is still further an advantage of the present invention to provide a method of transferring heat from a component through a heat exchanger to a heat reservoir without requiring additional energy.

It is further an advantage of the present invention to provide a method of generating electricity from heat dissipated from a component without requiring additional energy.

These and other advantages and features of the invention are described in greater detail in the following detailed description of the presently preferred embodiments with reference to the accompanying drawings.

DETAILED DESCRIPTION OF THE PREFERRED EMBODIMENTS

As discussed above, there is provided an apparatus and method for efficiently transferring unconverted or remaining waste heat away from a heat source, such as an electrical component, and for converting the waste heat from the heat source into other forms of energy such as work energy.

The present invention is directed to converting waste heat for energy conversion in a 75° C.–150° C. temperature range into other useful energy. As described more fully below, in accordance with principles of the invention, power is derived from waste heat via an energy converter producing approximately 1W–10W yet only occupying several $cm^3$ of volume. Thus, the present invention can generate power derived from the waste heat for operating other devices for cooling purposes (such as a fan or a miniature refrigerator), extending battery life, recharging depleted batteries, and reducing the electricity demand on the power grid in the office, home and portable use.

Herein, the term shape memory alloy is applied to a group of metallic alloys that are capable of returning to some previously defined shape or size when subjected to the appropriate thermal change. Generally, these materials can be plastically deformed at some relatively low temperature and upon exposure to some higher temperature will return to their shape prior to deformation. Alloys that exhibit shape memory only upon heating are referred to as having a one way shape memory. Some alloys, however, also undergo a change in shape upon recooling referred to as having two way shape memory. A relatively wide variety of alloys are known to exhibit the shape memory effect that can recover substantial amounts of strain or that can generate significant force upon changing shape.

At a lower temperature, the crystalline form of the metal, known as martensite, displays very strong inter-molecular bonding. At a higher temperature, the crystalline form of the metal, known as austenite, contains relatively loosely bonded molecules. Usually, there is hysteresis during the transformation. At this lower temperature in the martensite state, the alloy can be easily deformed without losing physical properties, e.g. heat conductivity. Thus, in the martensite state, a bias, such as a spring, can deform the alloy into a different configuration in which the alloy will remain until acted upon by another force.

Raising the temperature of shape memory alloy above a transition point, however, causes atoms displaced during deformation in the martensite state to return to predeformed positions in the austenite state as the temperature rise causes the formation of strong energetic and directional electron bonds that pull the displaced atoms back. Thus, when sufficient heat is applied to exceed the austenite temperature of the alloy, crystal formation is immediately changed to austenite and the shape memory alloy recovers to the original configuration. Thus, with the proper shape memory alloy and amount of heat, the deformed martensitic alloy will revert to its austenitic phase and return to its "memory" imparted configuration after heating.

The phase change does not occur at a single temperature for all shape memory alloys but over a range of temperatures that varies with each shape memory alloy. Accordingly, memory shape alloys can be repeatedly deformed and recovered in alternation by deforming the memory shape alloy below the transition temperature at the martensite state and by heating the memory shaped alloy back to the austenite state.

Figure 1:
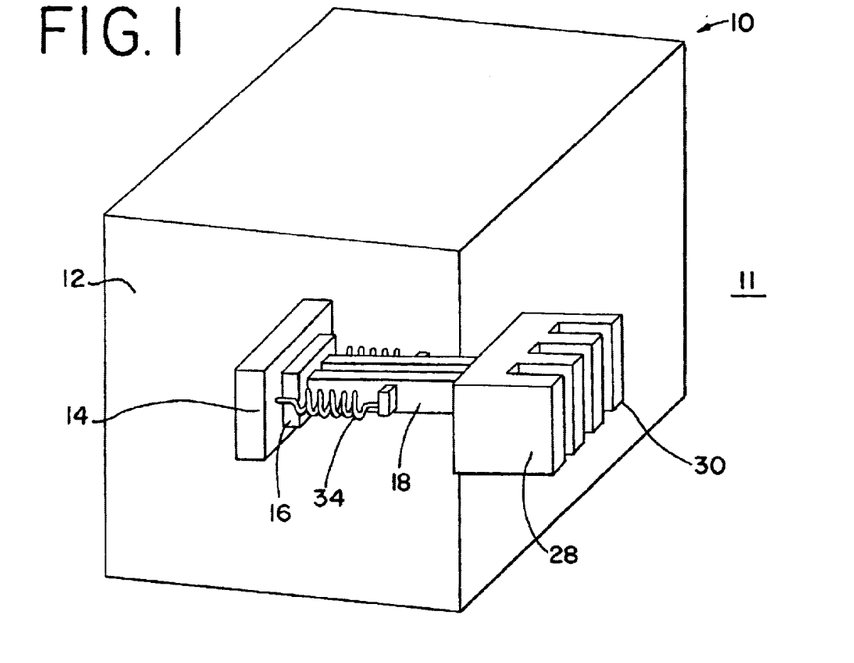
FIG. 1 illustrates in perspective view a heat dissipating device embodying principles of the invention.

FIG. 1 illustrates in perspective view an exemplary shape memory allow generator 10 to convert heat energy or waste heat into work energy in accordance with general principles of the invention. In FIG. 1, the heat dissipating device 10 thermally connects to an electrical component 16 of an electrical device 12.

The electrical component 16 may be one of a plurality of electrical components 16 that are part of the electrical device 12. Electrical components 16 may be any device that generates heat when operating or when power is supplied to the electrical components 16. Electrical components 16 may be heat sources that emit heat up to a temperature of 150° C. before thermal breakdown. As illustrated in FIG. 1, the electrical component 16 may be attached to a circuit board 14 that supports and provides electrical interconnections for the electrical component 16. The heat emitted by the electrical components 16 must be dissipated away from the electrical component 16 to prevent thermal breakdown. The present invention transfers the heat generated by the electrical components 16 out of the electrical device 12. The present invention also is capable of generating work energy from the emitted heat.

FIG. 1 shows a perspective view of the preferred embodiment of a shape memory alloy generator 10. The basis of the operation of the shape memory alloy generator 10 comprises changing the phase of a shape memory alloy member 18 by a temperature difference to transfer heat from an electrical component 16, e.g. a central processing unit, out to the ambient 11 through a heat exchanger 28. Typically, the electrical component 16 attaches to the printed circuit board 14 as shown in FIG. 1. Further, changing the phase of a shape memory alloy member 18 through an energy converter 34 produces a current across the shape memory alloy member 18. Further, this current can be harnessed for work.

Preferably, the shape memory alloy member 18 comprises a shape memory alloy. Excellent results are obtained when the shape memory alloy member 18 comprises alloys characterized by shape memory characteristics such as Ni—Ti, commonly known as Nitinol. Excellent results are also obtained with alloys comprised of Au—Cd, Cu—Al—Ni, Cu—Sn, Cu—Zn—Si, Cu—Zn—Sn, Cu—Zn—Al, Ni—Al, Mn—Cu, or Fe—Mn—Si. Other shape memory alloy members 18 comprise at least one of a Al, Au, Cd, Cu, Fe, Mn, Ni, Si, Sn or Ti alloy or combination thereof. Further, excellent results are obtained using alloys including a copper alloy, a nickel alloy, a zinc alloy and a Cu—Zn alloy.

Figure 2:
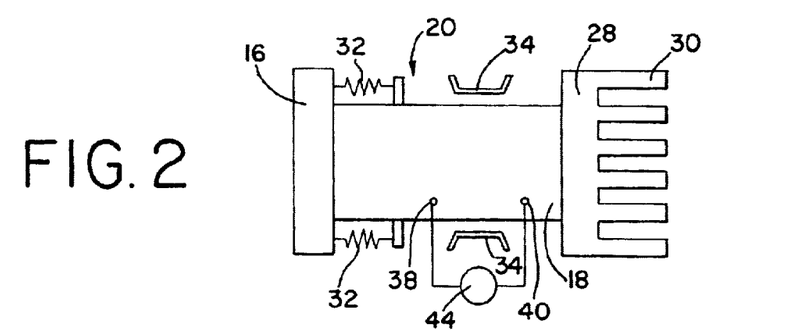
FIG. 2 illustrates in schematic form the heat dissipating device embodying principles of the invention.

Referring to FIG. 2, the heat dissipating device 10 includes at least one shape memory alloy member 18 configured to receive heat and configured to dissipate heat from the electrical component 16. Each shape memory alloy member 18 may be thermally positioned with an individual electrical component 16. The shape memory alloy member 18 is positioned between the electrical component 16 and the heat exchanger 28 where the shape memory alloy member 18 is illustrated as substantially linear shaped, although the shape memory alloy member 18 can be other shapes besides linear.

The shape memory alloy member 18 has a first configuration 20 in which the shape memory alloy member 18 is adjacently positioned to the electrical component 16 as shown in FIG. 2. A bias member 32, such as a spring, deforms the shape memory alloy member 18 to the first configuration 20. It should be noted, however, that the bias member 32 can also include, but is not limited to, compression members, rods, gears, and electromagnetics.

Figure 3:
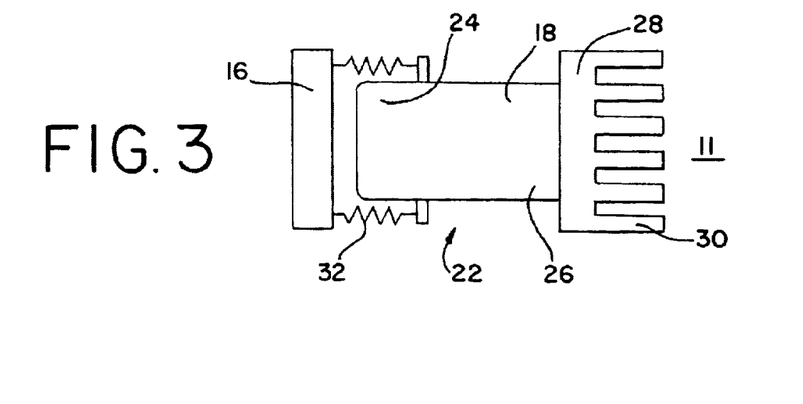
FIG. 3 illustrates in schematic form the heat dissipating device of FIG. 2 in a different configuration embodying principles of the invention.

Referring now to FIG. 3, the shape memory alloy member 18 has a first end 24 and a second end 26 where the first end 24 is adjacently positioned to the electrical component 16. The shape memory alloy member 18 changes phase through hysteresis when exposed to the electrical component 16 above a first temperature dependant on the material characteristics of the shape memory alloy member 18. The phase change in the austenite state linearly contracts the shape memory alloy member 18 to the second configuration 22 and then cools corresponding to the martensite state at a second temperature. In the second configuration 22, the shape memory alloy member 18 detaches from the electrical component 16 as shown in FIG. 3.

While contracting to the second configuration 22, the heat is dissipated from the electrical component 16 by transferring through the shape memory alloy member 18. The heat exchanger 28, thermally connected to the shape memory alloy member 18 opposite the electrical component 16 at the second end 26, dissipates the heat to the ambient 11 via heat fins 30 as shown in FIG. 3.

As the shape memory alloy member 18 detaches from the electrical component 16 in the austenite state to the second configuration 22, the shape memory alloy member 18 is not exposed to the electrical component 16 thereby cooling the shape memory alloy member 18. The bias member 32 which is fixed substantially near the first end 24 biases the shape memory alloy member 18 back to the first configuration 20 to again expose the shape memory alloy member 18 to the electrical component 16 in order to reciprocate the shape memory alloy member 18 for the heat dissipation. Thus, the heat dissipation causes the shape memory alloy member 18 to detach and linearly contract away from the electrical component 16 while the bias member 32 causes the shape memory alloy member 18 when cooled to linearly extend back to the electrical component 16 resulting in a reciprocating movement or cyclic displacement of the shape memory alloy member 18 as shown comparing FIGS. 2 and 3.

Figure 4:
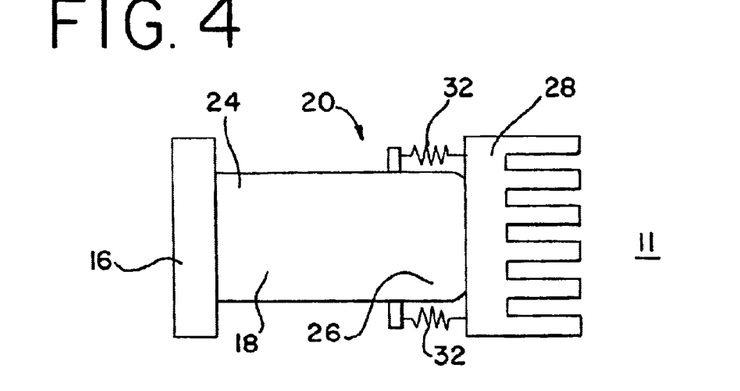
FIG. 4 illustrates in schematic form another embodiment of the heat dissipating device embodying principles of the invention.
Figure 5:
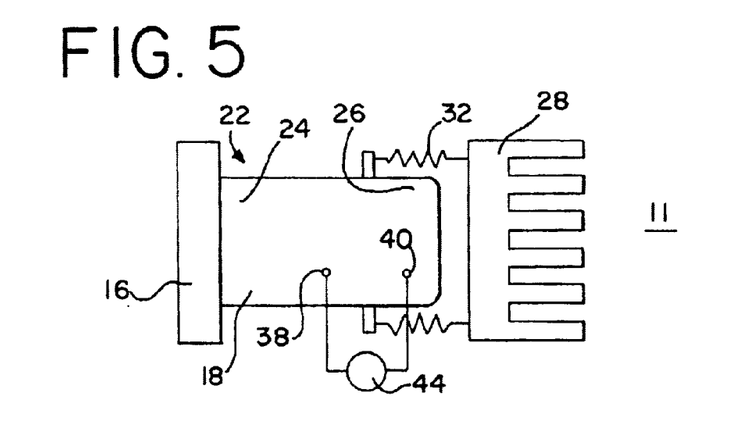
FIG. 5 illustrates in schematic form the heat dissipating device of FIG. 4 in a different configuration embodying principles of the invention.
Figure 6:
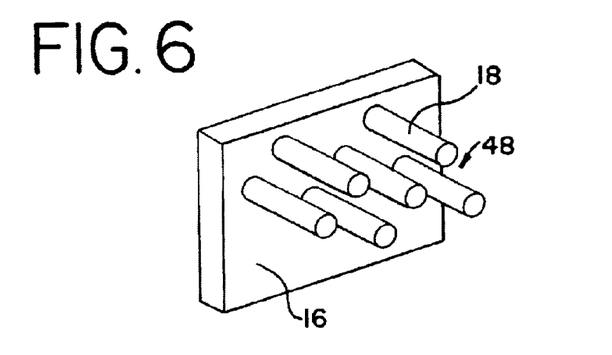
FIG. 6 illustrates in perspective view another embodiment of a portion of the heat dissipating device embodying principles of the invention.

FIGS. 4 and 5 depict in schematic form another embodiment of the invention employing other principles of the invention. In this other embodiment, the memory shape alloy member 18 linearly contracts to the second configuration 22 away from the heat exchanger 28 as shown in FIG. 5. In this alternative embodiment, the bias member 32 connects substantially near the second end 26 of the shape memory alloy member 18 to extendably bias the shape memory alloy member 18 back to the first configuration 20 of FIG. 4 toward the heat exchanger 28. In this embodiment, the shape memory alloy member 18 is thermally connected to the electrical component 16 and adjacently positioned to the heat exchanger 28. The shape memory alloy member 18 detaches from the heat exchanger 28 in the second configuration 22 by the heat emitted from electrical component 16 and extends back to the first configuration 20 upon cooling toward the heat exchanger 28 by the bias member 32. Referring to FIG. 6, the plurality of shape memory alloy members 18 may form a shape memory alloy array 48 which in turn thermally connects to the electrical component 16.

Figure 7:
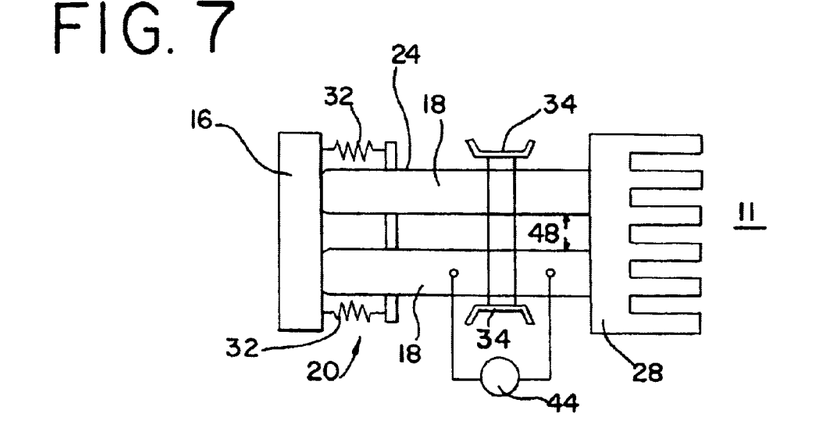
FIG. 7 illustrates in schematic form another embodiment of the heat dissipating device embodying principles of the invention.
Figure 8:
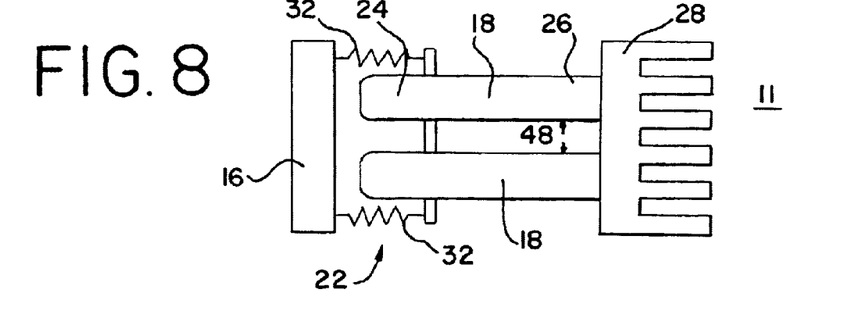
FIG. 8 illustrates in perspective view the heat dissipating device of FIG. 7 in a different configuration embodying principles of the invention.

FIGS. 7 and 8 depict in schematic form another embodiment of the invention in which a plurality of shape memory alloy members 18 may be used. The plurality of shape memory alloy members 18 may be used to transfer heat from a plurality of electrical components 16 where each shape memory alloy member 18 dissipates heat from each electrical component 16. Alternatively, a plurality of shape memory alloy members 18 may be used to dissipate heat from one electrical component 16. As shown in FIG. 7, the bias member 32 connects near the first end 24 of the shape memory alloy member 18 to bias the shape memory array 48 to the first configuration 20 toward the electrical component 16. Referring now to FIG. 8, the shape memory array 48 detaches from the electrical component 16 because of the heat emitted by the electrical component 16 and contracts to the second configuration 22. During the detachment, the heat emitted transfers to the heat exchanger 28 via the shape memory alloy members 18 and into the ambient 11.

Figure 9:
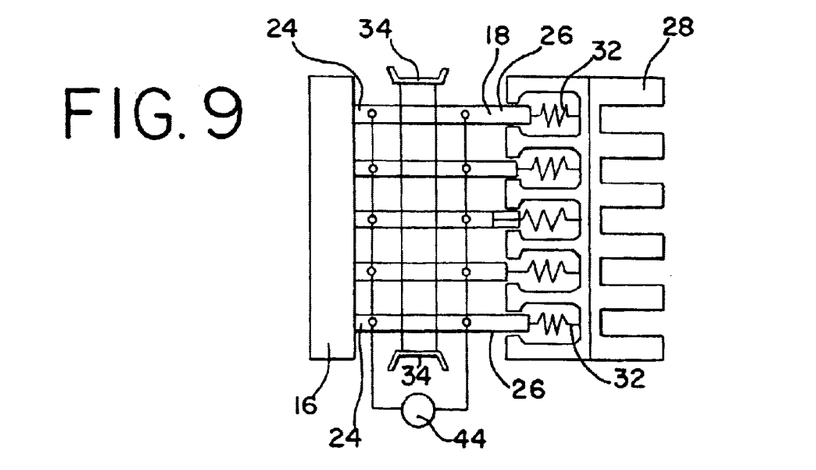
FIG. 9 illustrates in schematic form another embodiment of the heat dissipating device embodying principles of the invention.

FIG. 9 depicts in schematic form another embodiment of the invention. In this embodiment, each shape memory alloy member 18 of the shape memory array 48 connects to each bias member 32. In this embodiment the bias member 32 may also flexibly connect to either the first end 24 or the second end 26 to extendably bias to the first configuration 20 either toward the electrical component 16 or toward the heat exchanger 28. As shown in FIG. 9, the bias member 32 connects to each second end 26 near the heat exchanger 28.

Figure 10:
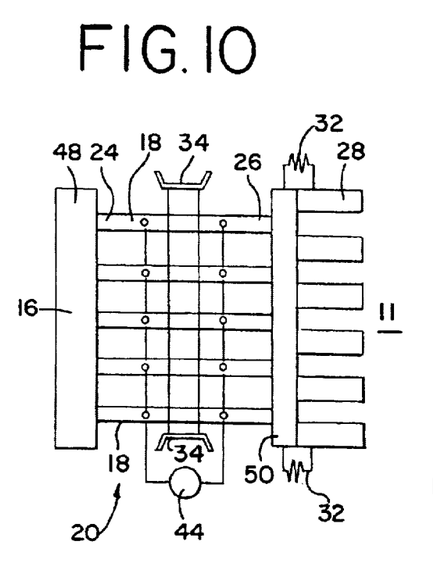
FIG. 10 illustrates in schematic form another embodiment of the heat dissipating embodying principles of the invention.
Figure 11:
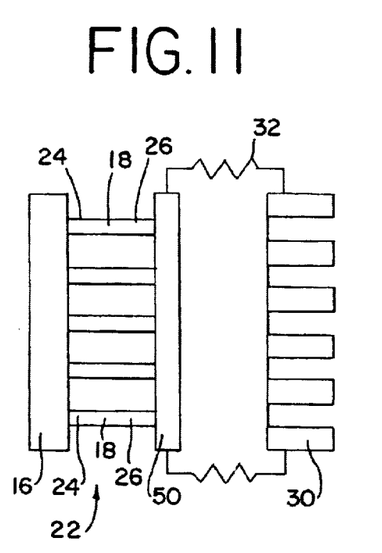
FIG. 11 illustrates in schematic form the heat dissipating device of FIG. 10 in a different configuration embodying principles of the invention.

FIGS. 10 and 11 depict in schematic form another embodiment of the present invention incorporating a plurality of shape memory alloy members 18. In this embodiment, a plate member 50 is positioned between the electrical component 16 and the heat exchanger 28 where the plate member 50 thermally connects to each shape memory alloy member 18. Each shape memory alloy member 18 thermally connects to the plate member 50 at the second end 26 while thermally connecting to the electrical component 16 at the first end 24 displaying the first configuration 20 as shown in FIG. 10.

Referring to FIG. 11 the heat emitted by the electrical component 16 phase changes the plurality of the shape memory alloy members 18 to linearly contract the plurality of shape memory alloy members 18 to the second configuration 22 toward the electrical component 16. Accordingly, the plate member 50 is pulled toward the electrical component 16 as shown in FIG. 11. Upon cooling, the bias member 32, which is connected to both the plate member 50 and the heat exchanger 28, biases the plate member 50 back toward the heat exchanger 28 to linearly extend the plurality of shape memory alloy members 18 back to the first configuration 20 as shown in FIG. 10.

Figure 12:
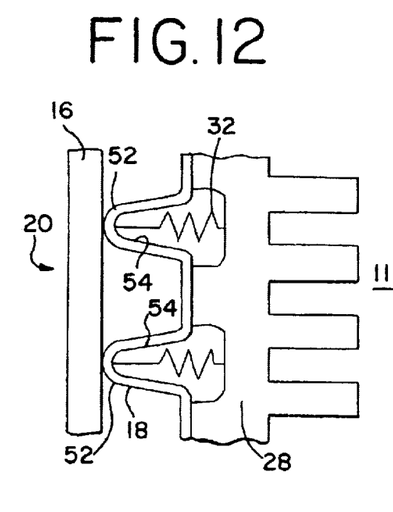
FIG. 12 illustrates in schematic form another embodiment of the heat dissipating embodying principles of the invention.
Figure 13:
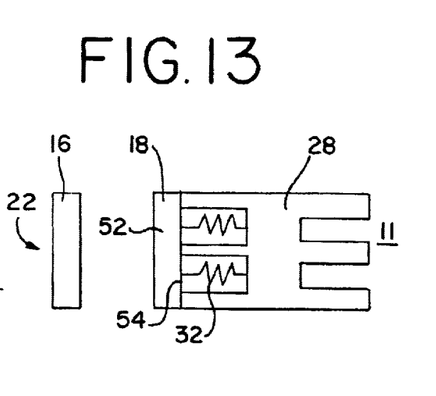
FIG. 13 illustrates in schematic form the heat dissipating device of FIG. 12 in a different configuration embodying principles of the invention.

FIGS. 12, and 13 depict in schematic form another embodiment of the present invention. Referring to FIG. 12, the shape memory alloy member 18 is curve shaped having a first side 52 and a second side 54 in the first configuration 20. In this embodiment, the first side 54 is adjacently positioned to the electrical component 16 in the curve shape. The shape memory alloy member 18 changes phase through hysteresis when exposed to the electrical component 16 above the first temperature. Referring to FIG. 13, the phase change thermally contracts the shape memory alloy member 18 to second configuration 22 corresponding to the second temperature. In the second configuration 22, the shape memory alloy member 18 detaches from the electrical component 16 and contracts to a linear shape as shown in FIG. 13.

While contracting to the second configuration 22, the heat dissipates from the electrical component 16 through the shape memory alloy member 18. The heat exchanger 28, thermally connected to the shape memory alloy member 18 opposite the electrical component 16, dissipates the heat to the ambient 11 as shown in FIGS. 12 and 13.

As shown in FIG. 13, because the shape memory alloy member 18 is detached from the electrical component in the second configuration 22, the shape memory alloy member 18 is not exposed to the electrical component 16 cooling the shape memory alloy member 18. The bias member 32 which has one end on the second side 54 biases the shape memory alloy member 18 back to the first configuration 20 to again expose the shape memory alloy member 18 to the electrical component 16 in order to reciprocate the heat dissipation as shown between FIG. 12 and FIG. 13.

The heat dissipation causes the shape memory alloy member 18 to detach and contract from the curve shape to the linear shape away from the electrical component 16. The bias member 32, in turn, causes the shape memory alloy member 18 to extend back to a curvilinear shape and position near the electrical component 16 resulting in the reciprocation or cyclic movement of the shape memory alloy member 18 during heat dissipation.

Figure 14:
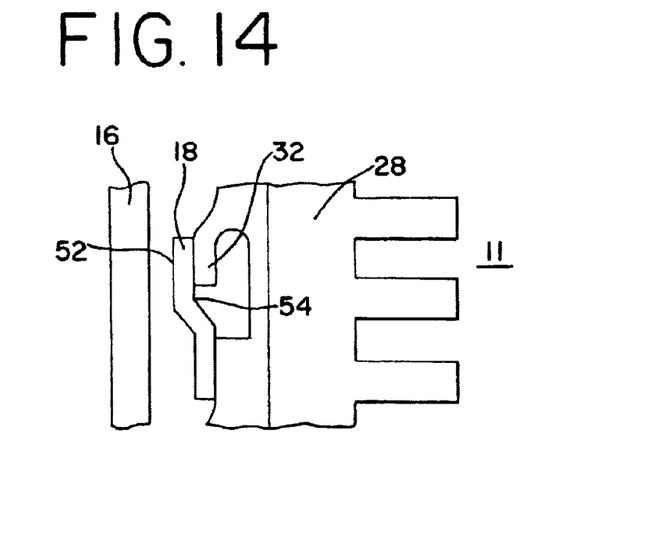
FIG. 14 illustrates in schematic form another embodiment of the heat dissipating device embodying principles of the invention.

FIG. 14 depicts in schematic form another embodiment of the present invention. In this embodiment, the bias member 32 is a compression member which biases the shape memory alloy member 18 back and forth between the electrical components 16 and the heat exchanger 28.

Referring back to FIG. 2, the heat dissipating device 10 further comprises at least one energy converter 34 to convert the heat emitted by the electrical component 16 into energy such as electrical energy. In this embodiment, the energy converter 34 is operatively positioned around the at least one memory shape alloy member 18 to create a current in response to the reciprocal movement of shape memory alloy member 18. Further, a first electrode 38 and a second electrode 40 connected on opposite sides of the energy converter 34 to the shape memory alloy member 18 direct the current to an electrical storage 44. Thus, by using the reciprocating movement, an electrical current can be generated within the shape memory alloy member 18 which can be derived to the electrical storage 44, e.g. a battery. In one embodiment, the energy converter 34 may include a magnet. However, it should be noted that the energy converter 34 can also include but is not limited to, a piezoelectric generator.

Figure 15:
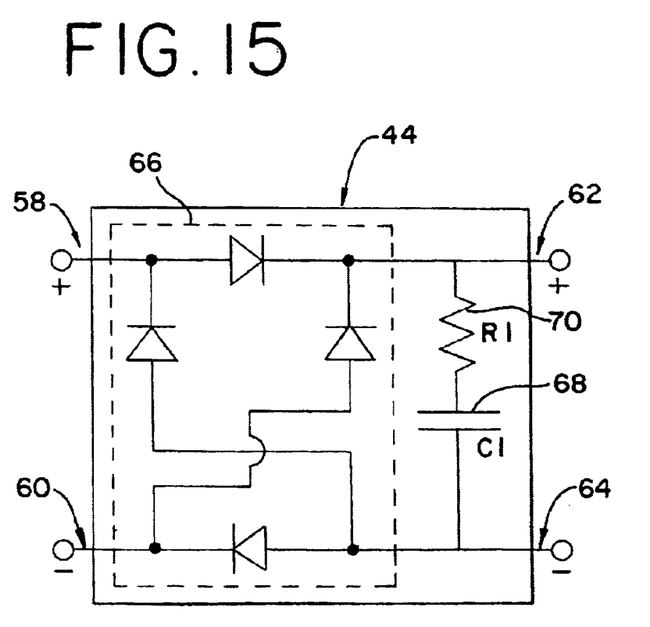
FIG. 15 illustrates in schematic form an electrical storage embodying principles of the invention.

Turning to FIG. 15, the electrical storage 44 is shown in schematic form. The electrical storage 44 has a positive input 58 and a negative input 60 that are each electrically connected to a respective positive and negative electrode (not shown) of the energy converter 34. The electrical storage 44 receives and stores the current from the energy converter 34. The electrical storage 44 also has a first and a second output 62 and 64 that can be connected to a load device (not shown).

The electrical storage 44 may include a standard full-wave rectifier 66 and a capacitor 68 that is electrically connected to the full-wave rectifier 66. The full-wave rectifier 66 converts the asynchronous current received from the energy converter 34 to a D.C. voltage that is stored in the capacitor 68. The electrical storage 44 may also include a resistor 70 that controls the current flow to the load device that may be connected to the first and second outputs 62 and 64 of the electrical storage 44. It is contemplated that the electrical storage 44 may include any suitable means for receiving an alternating current, transforming the alternating current to a direct current, and storing the energy transported by the direct current. Thus, the energy converter 34 converts the kinetic energy of the movement of the shape memory alloy member 18 to energy, preferably electrical energy, which can be stored in the electrical storage 44. Referring to FIGS. 6, 9 and 10, the energy converter 34 may also be connected to the plurality of shape memory alloy members 18 in the other embodiments.

Figure 15A:
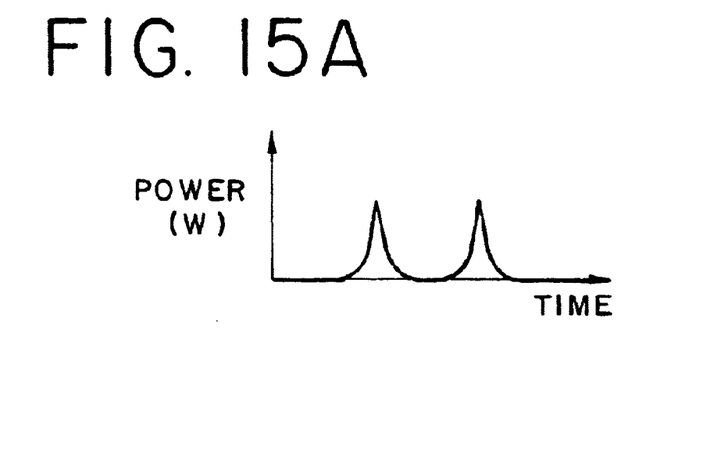
FIG. 15a illustrates in graph form the output for the heat dissipating device embodying principles of the invention.
Figure 15B:
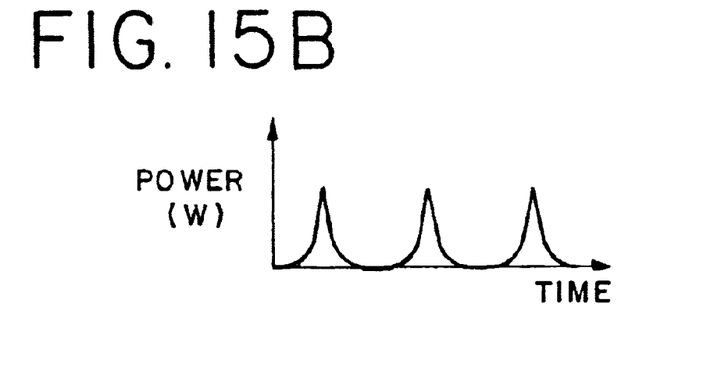
FIG. 15b illustrates in graph form the output for the heat dissipating device embodying principles of the invention.
Figure 15C:
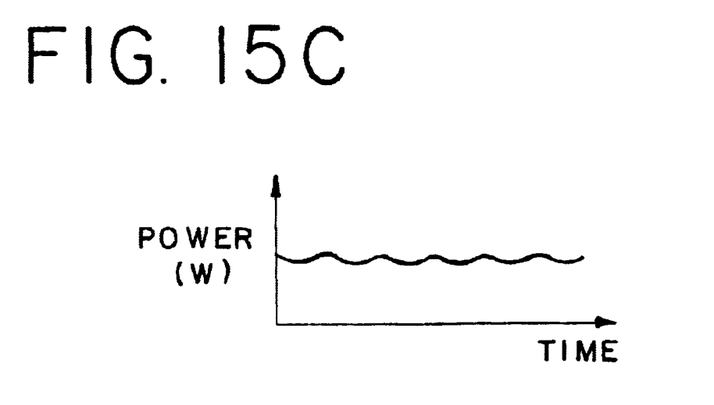
FIG. 15c illustrates in graph form the output for the heat dissipating device embodying principles of the invention.
Figure 16A:
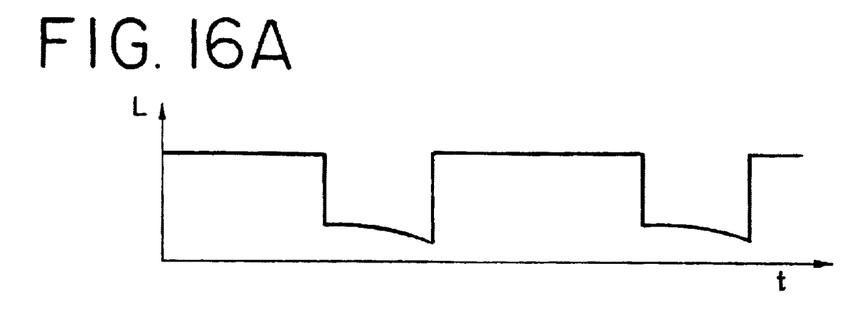
FIG. 16a illustrates in graph form the response output the heat dissipating device embodying principles of the invention.
Figure 16B:
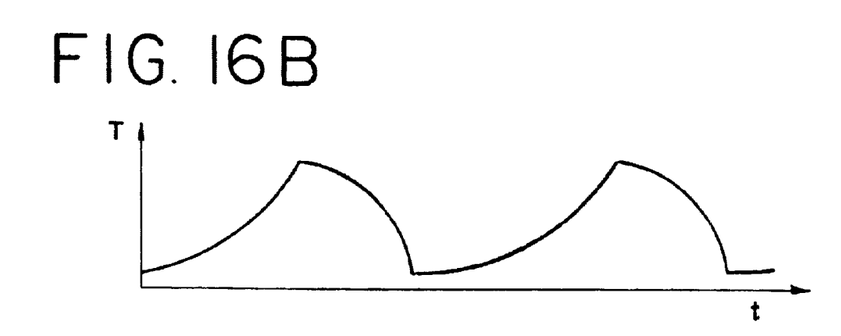
FIG. 16b illustrates in graph form the response output for the heat dissipating device embodying principles of the invention.
Figure 16C:
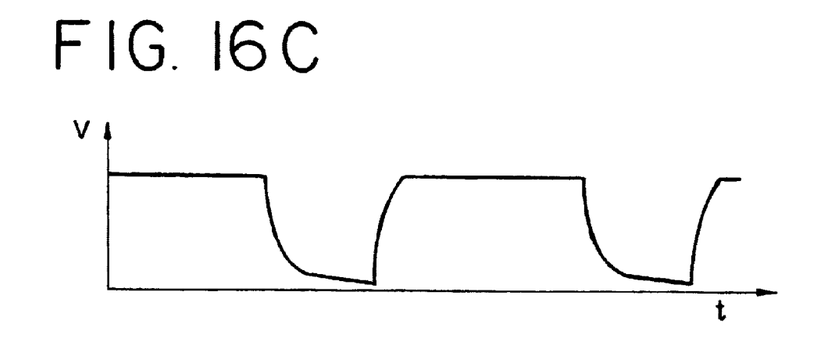
FIG. 16c illustrates in graph form the response output for the heat dissipating device embodying principles of the invention.
Figure 16D:
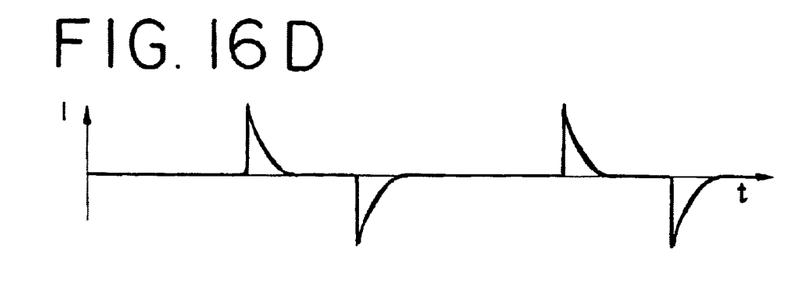
FIG. 16d illustrates in graph form the response output for the heat dissipating device embodying principles of the invention.

Referring to FIGS. 15a, 15b and 15c, in the embodiments utilizing more than one shape memory alloy member 18, the electrical output of the energy converter 34 may be accumulated over time. As the energy converter 34 produces current in response to the movement of one of the shape memory alloy members 18, another energy converter 34 may produce current in response to the movement of another of the shape memory alloy members 18. Alternatively, the energy converter 34 may produce the current in response to the movement of the plurality of shape memory 18 alloy members. As shown in FIGS. 15a, 15b and 15c, the power out from each shape memory alloy member 18 can be added together resulting in constant power produced by the energy converter 34. Further, as shown in FIG. 16a, FIG. 16b, FIG. 16c and FIG. 16d, the change in length of the shape memory alloy member 18 corresponds to the temperature of the electrical component 16 while also corresponding to the voltage and current of the energy converter 34.

Figure 17:
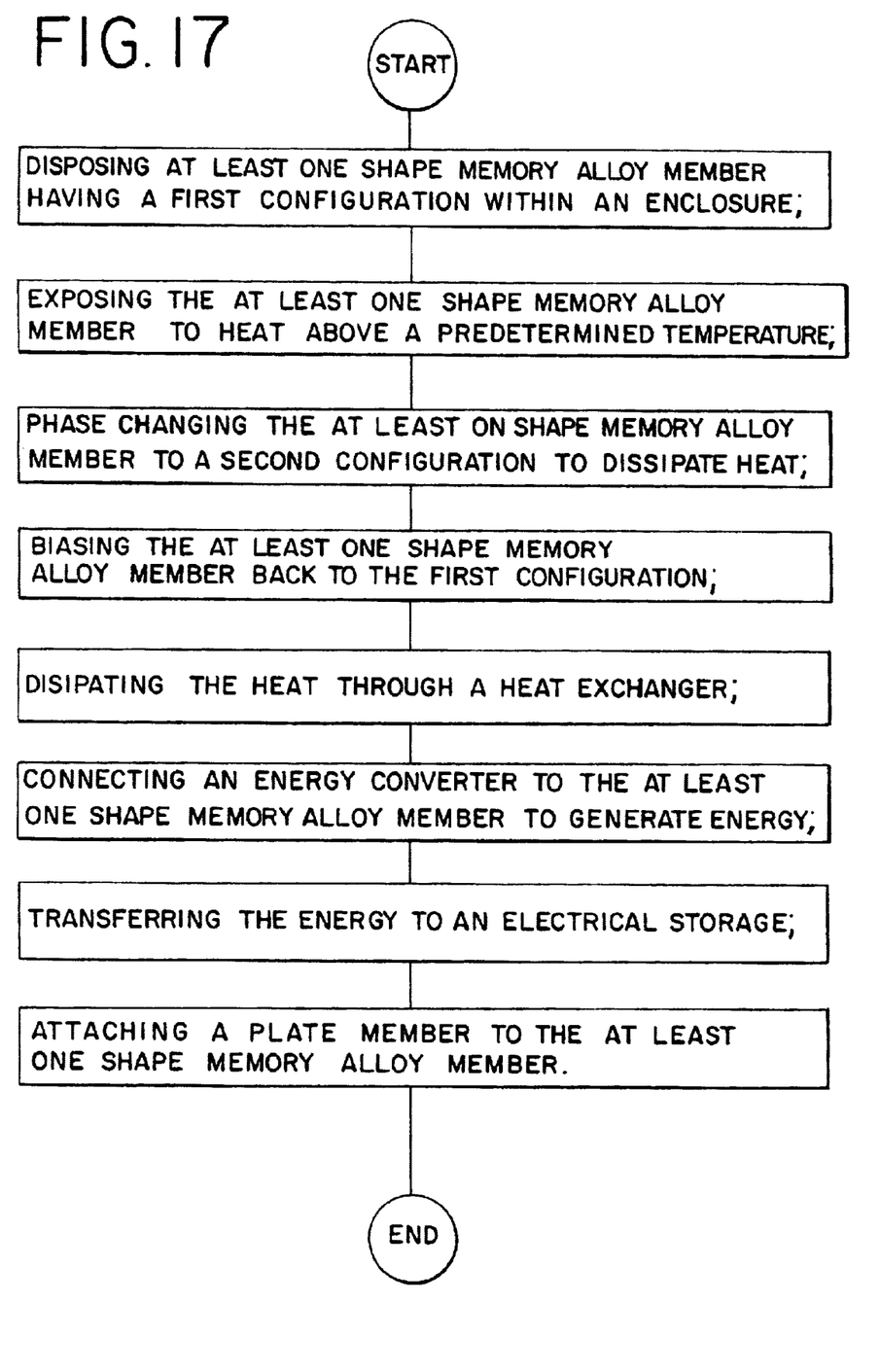
FIG. 17 is a flowchart depicting an exemplary process for dissipating heat and for generating energy from the dissipated heat.

In FIG. 17, a flow chart of an exemplary process for dissipating heat from the electrical component 16 to the ambient 11 and for producing energy from the dissipated heat is shown. In use, at least one shape memory alloy member 18 is disposed within an enclosure 12 such as a computer wherein the first end 24 is positioned adjacent to an electrical component 16 while the second end 26 is positioned adjacent to the heat exchanger 28. Within the enclosure, the shape memory alloy member 18 has the first configuration 20 corresponding to the first temperature. In this configuration, the shape memory alloy member 18 is positioned adjacent to the electrical component 16 which may be fixed to the printed circuit board 14.

As the shape memory alloy member 18 is exposed to the electrical component 16, the heat from the electrical component 16 transfers to the shape memory alloy member 18. Accordingly, the shape memory alloy member 18 phase changes by the heat emitted from the electrical component 16. The shape memory alloy member 18 phase changes to the second configuration 22 corresponding to the second temperature while dissipating the heat from the electrical component 16 through the heat exchanger 28. After the heat dissipates, the shape memory alloy member 18 biases back to the first configuration 20 by the bias member 32.

In another method, a plate member 50 is thermally attached to the plurality of shape memory alloy members 18. In this method, the plate member 50 is positioned between the electrical component 16 and the heat exchanger 28 wherein the bias member 32 connects to the plate member 50. Thus, the at least one shape memory alloy member 18 contracts to the second configuration 22 pulling the plate member 50 toward the electrical component 16 during heat transfer. The bias member 32 then in turn biases the plate member 50 along with the plurality of shape memory alloy members 18 back to the first configuration 20.

This cyclic movement of the shape summary alloy member 18 causes the energy converter 34 to generate electric current. The energy converter 34 is connected to the at least one shape memory alloy member 18 wherein the energy converter 34 creates current in response to the movement of the shape memory alloy member 18. The energy is derived off from the at least one shape memory alloy member 18 to the electrical storage 44 via the energy converter 34.

Although the foregoing detailed description of the present invention has been described by reference to various embodiments, and the best mode contemplated for carrying out the prevention invention has been herein shown and described, it will be understood that modifications or variations in the structure and arrangement of these embodiments other than there specifically set forth herein may be achieved by those skilled in the art and that such modifications are to be considered as being within the overall scope of the present invention.

What is claimed is:

1. A shape memory alloy heat dissipating device, comprising:
   a shape memory alloy member, the shape memory alloy member having a first configuration at a first temperature and a second configuration at a second different temperature;
   a heat exchanger, the heat exchanger thermally positioned adjacent to the shape memory alloy member to dissipate the heat therefrom to phase change the shape memory alloy member to the second configuration, the first and second temperatures being less than about 200° C.; and
   a bias member, the bias member flexibly connected to the shape memory alloy to bias the shape memory alloy member back to the first configuration after heat dissipation.

2. The shape memory alloy device of claim 1, wherein the shape memory alloy member is configured to change phase when exposed to heat above the first temperature.

3. The shape memory alloy device of claim 1, wherein the shape memory alloy member is configured to thermally contract to the second configuration to transfer the heat therethrough.

4. The shape memory alloy device of claim 1, wherein the shape memory alloy member is linearly shaped having a first end and a second end, the first end adjacently positioned to an electrical component, the second end thermally connected to the heat exchanger, the shape memory alloy member configured to contract to the second configuration away from the electrical component.

5. The shape memory alloy device of claim 4, wherein the bias member comprises a spring, the spring connected substantially near the first end to extendably bias the shape memory alloy member back to the first configuration toward the electrical component.

6. The shape memory alloy device of claim 4, wherein the spring connects substantially near the second end to extendably bias the shape memory alloy member back to the first configuration toward the heat exchanger.

7. The shape memory alloy device of claim 1, wherein the shape memory alloy member is configured to contract to the second configuration away from the heat exchanger.

8. The shape memory alloy device of claim 1, further comprising an energy converter, the energy converter operatively positioned around the shape memory alloy member.

9. The shape memory alloy device of claim 8, further comprising a first electrode and a second electrode, the first electrode and the second electrode operatively connected to the shape memory alloy member on opposite sides of the energy converter.

10. The shape memory alloy device of claim 8, wherein the energy converter comprises a magnet, the magnet configured to apply a magnetic field across the shape memory alloy member.

11. The shape memory alloy device of claim 8, wherein the energy converter is a piezoelectric generator.

12. The shape memory alloy device of claim 1, wherein the shape memory alloy member comprises at least one of a Al, Au, Cd, Cu, Fe, Mn, Ni, Si, Sn, Ti alloy or combination thereof.

13. The shape memory alloy device of claim 1, wherein the shape memory alloy member comprises at least one of a Ni—Ti, Au—Cd, Cu—Al—Ni, Cu—Sn, Cu—Zn—Si, Si, Cu—Zn—Sn, Cu—Zn—Al, Ni—Al, Mn—Cu, or Fe—Mn—Si.

14. The shape memory alloy device of claim 1, wherein the shape memory alloy member is Nitinol.

15. The shape memory alloy device of claim 1, wherein the shape memory alloy member comprises a copper alloy.

16. The shape memory alloy device of claim 1, wherein the shape memory alloy member comprises a nickel alloy.

17. The shape memory alloy device of claim 1, wherein the shape memory alloy member comprises a zinc alloy.

18. The shape memory alloy device of claim 1, wherein the shape memory alloy member comprises a Cu—Zn alloy.

19. A shape memory alloy device to dissipate heat out of a heated environment to produce electricity, comprising:
   a plurality of shape memory alloy members, each shape memory alloy member having a first configuration at a first temperature and a second configuration at a second temperature, each shape memory alloy member adapted to change phase via hysteresis from the first configuration to the second configuration when exposed to heat above a first temperature, each shape memory alloy member configured to contract to the second configuration at a second temperature to transfer the heat;
   a plate member, the plate member thermally connected to each shape memory alloy member;
   a heat exchanger, the heat exchanger thermally positioned adjacent to the plate member opposite the plurality of shape memory alloy members;
   a bias member, the bias member flexibly connected to the plate member and the heat exchanger to bias the plate member toward the heat exchanger to extend the plurality of shape memory alloy members back to the first configuration after heat dissipation; and
   an energy converter, the energy converter operatively fixed to the plurality of shape memory alloy members to create a current therein.

20. The shape memory alloy device of claim 19, wherein each shape memory alloy member has a first end and a second end, the first end thermally connected to an electrical component, the second end thermally connected to the plate member, each shape memory alloy member configured to contract to the second configuration away from the heat exchanger.

21. The shape memory alloy device of claim 19, wherein the bias member comprises a spring.

22. The shape memory alloy device of claim 19, wherein the bias member comprises a compression member.

23. The shape memory alloy device of claim 19, wherein the energy converter comprises an electromagnetic generator.

24. The shape memory alloy device of claim 19, wherein the energy converter comprises a piezoelectric generator.

25. The shape memory alloy device of claim 19, wherein the shape memory alloy members comprises at least one of a Al, Au, Cd, Cu, Fe, Mn, Ni, Si, Sn, Ti alloy or combination thereof.

26. The shape memory alloy device of claim 19, wherein the shape memory alloy members comprises at least one of a Ni—Ti, Au—Cd, Cu—Al—Ni, Cu—Sn, Cu—Zn—Si, Cu—Zn—Sn, Cu—Zn—Al, Ni—Al, Mn—Cu, Fe—Mn—Si.

27. The shape memory alloy device of claim 19, wherein the shape memory alloy members comprises Nitinol.

28. The shape memory alloy device of claim 19, wherein the shape memory alloy members comprises a copper alloy.

29. The shape memory alloy device of claim 19, wherein the shape memory alloy members comprises a nickel alloy.

30. The shape memory alloy device of claim 19, wherein the shape memory alloy members comprises a zinc alloy.

31. The shape memory alloy device of claim 19, wherein the shape memory alloy members comprises a Cu—Zn alloy.

32. A shape memory alloy generator device to dissipate heat within a heated environment to produce electricity, comprising:
   at least one shape memory alloy member, the at least one shape memory alloy member having a first configuration, the first configuration being curvelinearly shaped having a first side and a second side, the at least one shape memory alloy member adapted to change phase when exposed to heat above a first temperature, the at least one shape memory alloy member configured to thermally deform to a second configuration at a second temperature to transfer the heat therethrough, the second configuration being linearly shaped; and
   at least one bias member, the at least one bias member fixed to the at least one shape memory alloy member to bias the shape memory alloy member back to the first configuration after the heat is dissipated.

33. The shape memory alloy generator of claim 32, further comprising a heat exchanger, the heat exchanger connected to the at least one shape memory alloy member to dissipate heat from the shape memory alloy member.

34. The shape memory alloy generator of claim 33, wherein the first side is adjacently disposed to an electrical component, the second side is thermally connected to the heat exchanger.

35. The shape memory alloy generator of claim 34, wherein the bias member comprises at least one spring to bias the at least one shape memory alloy back toward the electrical component.

36. The shape memory alloy generator of claim 34, wherein the bias member comprises at least one compression member to bias the shape memory alloy back toward the electrical component.

37. The shape memory alloy generator of claim 32, further comprising at least one energy converter, the at least one energy converter operatively connected around the shape memory alloy member to create a current therein.

38. The shape memory alloy generator of claim 32, wherein the shape memory alloy member comprises at least one of a Al, Au, Cd, Cu, Fe, Mn, Ni, Si, Sn, Ti alloy or combination thereof.

39. The shape memory alloy generator of claim 32, wherein the shape memory alloy member comprises at least one of a Ni—Ti, Au—Cd, Cu—Al—Ni, Cu—Sn, Cu—Zn—Si, Cu—Zn—Sn, Cu—Zn—Al, Ni—Al, Mn—Cu, Fe—Mn—Si.

40. The shape memory alloy generator of claim 32, wherein the shape memory alloy member is Nitinol.

41. The shape memory alloy generator of claim 32, wherein the shape memory alloy member comprises a copper alloy.

42. The shape memory alloy generator of claim 32, wherein the shape memory alloy member comprises a nickel alloy.

43. The shape memory alloy generator of claim 32, wherein the shape memory alloy member comprises a Cu—Zn alloy.

44. A method of dissipating waste heat from a heated environment to produce electricity, comprising:

a. disposing at least one shape memory alloy member having a first configuration within an enclosure;

b. exposing the at least one shape memory alloy to heat above a first temperature;

c. phase changing the at least one shape memory alloy to a second configuration at a second temperature to dissipate the heat from at least one shape memory alloy, the first and second temperature being less than about 200° C.; and d. biasing the at least one shape memory alloy back to the first configuration.

45. The method of dissipating heat according to claim 44, further comprising dissipating the heat through a heat exchanger.

46. The method of dissipating heat according to claim 44, further comprising connecting an energy converter to generate a current in response to the movement of the least one shape memory alloy member.

47. The method of dissipating heat according to claim 44, further comprising deriving the current to an external load.

48. The method of dissipating heat according to claim 44, further comprising thermally attaching the at least one shape memory alloy member to a plate member.

49. The method of dissipating heat according to claim 44, wherein the at least one shape memory alloy member has a first end and a second end, the first end adjacently positioned to an electrical component, the second end thermally connected to the heat exchanger, the at least one shape memory alloy member configured to contract to the second configuration.

* * * * *